United States Patent [19]
Beetz, Jr. et al.

[11] Patent Number: 5,997,713
[45] Date of Patent: Dec. 7, 1999

[54] SILICON ETCHING PROCESS FOR MAKING MICROCHANNEL PLATES

[75] Inventors: Charles P. Beetz, Jr., New Milford; Robert W. Boerstler, Woodbury, both of Conn.; John Steinbeck, Fitzwilliam, N.H.; David R. Winn, Wilton, Conn.

[73] Assignee: NanoSciences Corporation, Oxford, Conn.

[21] Appl. No.: 09/074,712

[22] Filed: May 8, 1998

Related U.S. Application Data

[60] Provisional application No. 60/049,023, Jun. 9, 1997, and provisional application No. 60/046,004, May 8, 1997.

[51] Int. Cl.$^6$ .............................. C25D 5/34; C25D 5/48; C25D 9/06; C25F 3/12
[52] U.S. Cl. .......................... 205/124; 205/219; 205/221; 205/223; 205/656; 205/665; 205/674; 205/675
[58] Field of Search ..................................... 205/124, 219, 205/221, 223, 656, 665, 674, 675

[56] References Cited

U.S. PATENT DOCUMENTS

| | | | |
|---|---|---|---|
| 4,874,484 | 10/1989 | Foell et al. . | |
| 5,139,624 | 8/1992 | Searson et al. | 204/129.3 |
| 5,262,021 | 11/1993 | Lehmann et al. | 204/129.55 |
| 5,348,627 | 9/1994 | Propst et al. . | |
| 5,431,766 | 7/1995 | Propst et al. . | |
| 5,529,950 | 6/1996 | Hoenlein et al. | 437/170 |
| 5,544,772 | 8/1996 | Soave et al. | 216/2 |
| 5,569,355 | 10/1996 | Then et al. . | |
| 5,635,706 | 6/1997 | She et al. . | |

OTHER PUBLICATIONS

Thin–Film Amorphous Silicon Dynodes for Electron Multiplication, G.W. Tasker, et al, (Materials Research Society, vol. 192).

The Physics of Macropore Formation in Low Doped n–Type Silicon, V. Lehmann, J. Electrochem. Soc. vol. 140 No. 10 Oct. 1993, The Electrochemical Society, Inc.

Properties of Silicon–Electrolyte Junctions and Their Application to Silicon Characterization, H. Föll, Appl. Phys. A 53,8–19 (1991).

A New Capacitor Technology Based On Porous Silicon, V. Lehmann, et al, Nov. 1995, Solid State Technology, pp. 99, 100, 102.

The Physics Of Macroporous Silicon Formation, V. Lehmann, Thin Solid Films 255 (1995) 1–4.

High Aspect Ratio Submicron Silicon Pillars Fabricated By Photoassisted Electrochemical Etching And Oxidation, J.W. Lau and G.J. Parker 1995 American Institute of Physics.

The Photoelectrochemical Oxidation of n–Si in Anhydrous HF–Acetonitrile, Eric Propst and Pual A. Kohl, J. Electrochem. Soc., vol. 140, No. 5, May 1993.

Processing of Three–Dimensional Microstructures Using Macraporous n–Type Silicon, Ottow, et al, J. Electrochem. Soc., vol. 143, No. 1 Jan. 1996.

The Electrochemical Oxidation of Silicon and Formation of Porous Silicon in Acetonitrile, E. Propst and Paul Kohl J. Electrochem. Soc., vol. 141, No. 4 Apr. 1994.

Microfabrication of Silicon Via Photoetching, The Electrochemical Society Proceedings vol. 94–32, pp. 350–361.

Sensor Fusion III, Apr. 19–20, 1990, SPIE—The International Society forOptical Engineering, vol. 1306.

Formation Mechanism and Properties of Electrochemically Etched Trenches in n–Type Silicon, V. Lehmann and H. Föll, J. Electrochem. Soc., vol. 137, No. 2 Feb. 1990.

Technology Of Channel Plate Manufacture, ACTA Electronica, vol. 14, No. 2, 1971, pp. 201–224.

*Primary Examiner*—Maria Nuzzolillo
*Assistant Examiner*—Angela J. Martin
*Attorney, Agent, or Firm*—Lerner, David, Littenberg, Krumholz & Mentlik, LLP

[57] ABSTRACT

An element with elongated, high aspect ratio channels such as microchannel plate is fabricated by electrochemical etching of a p-type silicon element in a electrolyte to form channels extending through the element. The electrolyte may be an aqueous electrolyte. For use as a microchannel plate, the; the silicon surfaces of the channels can be converted to insulating silicon dioxide, and a dynode material with a high electron emissivity can be deposited onto the insulating surfaces of the channels. New dynode materials are also disclosed.

26 Claims, 3 Drawing Sheets

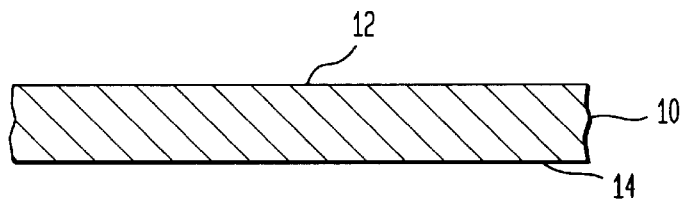
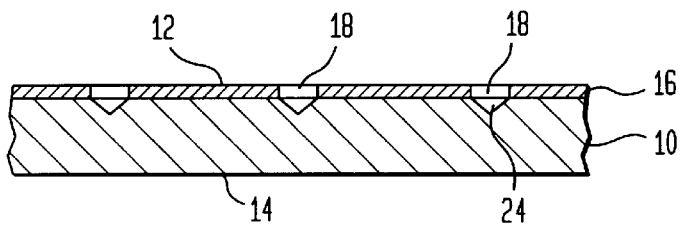
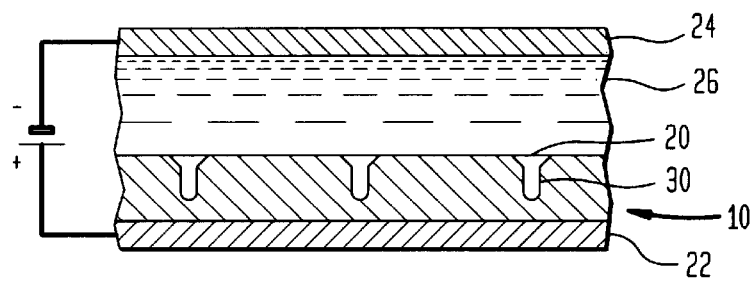
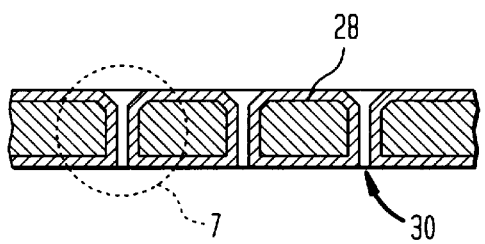
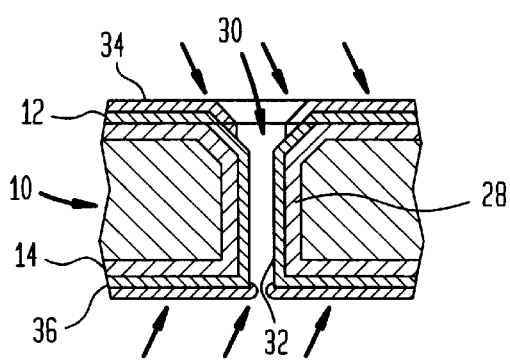

SILICON ETCHING PROCESS FOR MAKING MICROCHANNEL PLATES

CROSS REFERENCE TO RELATED APPLICATIONS

The present application claims benefit of U.S. Provisional Patent Applications 60/049,023, filed Jun. 9, 1997 and 60/046,004, filed May 8, 1997, the disclosures of which are hereby incorporated by reference herein.

FIELD OF THE INVENTION

The present invention relates to processes for etching silicon to form small diameter, deep channels extending through the silicon and further relates to devices incorporating such channels, including microchannel plates.

BACKGROUND

Microchannel plates, referred to herein as "MCP", are used in imaging amplification applications. In a typical application, an optical image is directed onto a photocathode, which emits a relatively small number of electrons in areas where light strikes the photocathode. The emitted electrons constitute a "photoelectron image". The MCP amplifies the photoelectron image. In an image intensifier such as a so-called "night vision" device,the amplified electron image is converted to a photon image on a phosphor screen anode. In other applications referred to as image converters, the amplified electron image is encoded as charge pixels in a silicon anode target, typically a CCD or other silicon pixel devices. MCP's are also used in the fastest rise time and lowest time-jitter photomultiplier tubes, for charged particle and photon detection in a wide variety of physical science instrumentation, in streak cameras, as amplifiers for CRT beams in oscilloscopes. MCP's provide the virtues of high speed with sub-ns rise/fall times and transit time spreads less than 100 ps; high gain (typically $10^3-10^6$/per stage); 2-D incident electron image preservation under amplification; immunity to magnetic fields, and compactness.

A typical Microchannel Plate (MCP) consists of an array of miniature channel electron multipliers 90 oriented parallel to each other, formed into a plate as illustrated in FIG. 1. Each channel electron multiplier is a tubular channel with an aspect ratio:

$$\alpha = L/d > 20, \qquad (1)$$

where L is the length of the channel, typically equal to the thickness of the plate, and d is the diameter of the channel. The channels in glass-based MCP are typically 10–15 $\mu$m in diameter, with a range of 5 $\mu$m–100 $\mu$m diameter, and $\alpha$ is typically between 40 and 100. The top and bottom of the plate are covered with metallic electrodes which create an electric field along the channel axis. Glass based MCP can be made from a lead containing glass. The lead glass matrix is formed by repeated drawing of a preform of etchable glass fibers clad with the lead glass until the fiber core shrinks to the desired diameter, whereupon the preform is sawed to the appropriate thickness and the fiber cores are etched away. The disc produced is heated in a reducing atmosphere to produce the secondary emitting surface or dynode layer and an underlying weakly conducting layer. Optionally, a thin layer of $SiO_2$ or $Si_3N_4$ may be deposited over this surface to provide a surface with an improved secondary electron yield and greater durability. FIG. 1 shows the overall schematic of the microchannel plate. In operation, a high voltage is applied between the front and back surfaces of the MCP. Typically, the resistance of the MCP is about $10^9\phi$. The electric field accelerates electrons in the channels and causes them to collide with the walls. The MCP operates by successive secondary emission of the electrons colliding with the walls of the channel, which have been activated to provide the dynode layer. At each collision, a secondary emission yield of electrons emitted per incident electron is approximated by:

$$\delta = AV_c^{1/2}, \qquad (2)$$

where A is a proportionality constant and $V_c$ is the electron collision energy in eV. For a wide range of lead glasses used in MCP's, A~0.2 and $\delta_{max}$~3.5 at 0.3 kV. The gain mechanism in a single channel is shown in FIG. 2. Primary electrons 92 impinge on the wall 94 of the channel, provoking emission of secondary electrons 96, which are accelerated along the channel and again impinge on the wall, provoking emission of further secondary electrons 98, and so on.

The gain of a channel is given by:

$$G = (AV/2\alpha V_o^{1/2})\gamma \qquad (3)$$

where $$\gamma = 4\alpha^2(V_o/V) \qquad (4)$$

and V is the total channel voltage, $V_o$ is the initial energy of the secondary electron, typically about 1 eV.

Gains for lead glass-based channels are normally about $10^3-10^4$ at V=1000 V depending on the activation processing. Setting $d(\ln G)/d\alpha=0$, we find extremes for the aspect ratio and gain as:

$$\alpha_M = AV/(3.3V_o^{1/2}) \qquad (5)$$

and $$\ln G_M = 0.184 A^2 V$$

For typical MCP channels using activated Pb-glass, the gain $G_M$ is about 1500 at V=1 kV with the extreme aspect ratio $\alpha_M$ being about 60. When the aspect ratio increases beyond $\alpha_M$ (for example, the plate thickness increases while the hole diameter is constant), the gain saturates at the maximum gain value. When the gain is increased or sufficient numbers of electrons are incident, the space-charge at the output of the channel will prevent linear gain behavior. In typical glass-based pores, the space-charge limit is ~$10^6$ electrons for a 10 $\mu$m pore. The space charge gain limit has been shown to be linear with the diameter (with V, $\alpha$ fixed).

A major problem for the MCP gain mechanism using reduced lead glass channels or other activation methods on glass is the decrease in gain with total charge drawn from the channel. The change in gain with use is an impediment to more widespread use of MCP, and is a major challenge for MCP manufacturers. Degradation of gain with operation is almost unavoidable with the chemistry of silica-based glasses, because of the evolution of and reaction with impurities in the channel by the electron bombardment of the channel surface.

It is also possible for the gain to increase before decreasing due to electron impact and heating during operation which cleans impurities and adsorbed gasses from the channel and increases the secondary emitter population. Such gain instability has limited the use of MCP in applications where stable gain is essential, and, in any case, limits the useful lifetime of MCP devices.

As set forth in U.S. Pat. No. 5,544,772, it has been proposed to make microchannel plate devices by light assisted electrochemical etching of n-type <100> silicon. The n-type silicon light assisted electrochemical etching process has distinct advantages over the conventional glass based manufacturing processes. However, there are significant disadvantages, which interfere with formation of deep (>50 μm) uniformly etched channels over large areas (such as 200 mm diameter silicon wafers). A further disadvantage of the n-type silicon electrochemical etching process is that a light source is required to generate holes so that etching may proceed.

As described, for example, in Lehmann et al, Formation Mechanism And Properties Of Electrochemically Etched Trenches In N-Type Silicon, J. Electrochemical Society, Vol. 137, #2, pp. 653–659 (1990) and in U.S. Pat. No. 4,874,484, light assisted electrochemical etching of n-type silicon produces deep channels perpendicular to the surface of the silicon. If the silicon surface is provided with pits at preselected locations, these channels form at the pits and hence at the same preselected locations. According to the Lehmann et al. article and in the '484 patent, the channels grow at their tips by selected etching of only the material at the tips of the channel. As described in these references and in numerous other references, it has long been believed that the mechanism responsible for such selective etching involves depletion of holes in the n-doped silicon and concentration of the few remaining holes at the tips of the channels due to the influences of electrical fields present in the process. Thus, the process of controlled deep channel growth at the preselected locations has been applied only in n-type silicon.

Propst et al., The Electrochemical Oxidation Of Silicon And Formation Of Porous Silicon In Acetonitrile, J. Electrochemical Society, Vol. 141, #4, pp 1006–1013 (1994) discloses the formation of deep channels at random locations using electrochemical etching of p-type silicon in a non-aqueous, anhydrous electrolyte. This reference does not disclose processes for forming deep channels at the preselected locations. Moreover, this reference emphasizes that aqueous electrolytes result in formation of highly branched, porous structures rather than deep, narrow channels of the types requires for microchannel plates and other applications. Similar teachings are found in Rieger et al., Microfabrication of silicon via Photoetching, the Electrochemical Society Proceedings, Vol. 94–361 (1994). Prost et al. U.S. Pat. 5,348,627 and 5,431,766 relate to the same work.

Despite these and other efforts in the art, there are substantial needs for further improvements in processes for forming deep, high-aspect ratio channels in silicon. It would be desirable to provide a process for forming channels in p-type silicon at preselected locations. P-type silicon wafers are fabricated in large numbers for use in manufacture of conventional silicon semiconductor devices. Therefore, p-type wafers are readily available at low cost. It would be desirable to be able to fabricate a device such as a microchannel plate having elongated channels therein at preselected locations starting from these economical, low cost wafers.

The processes used for forming channels in silicon heretofore have operated at the relatively low etch rates, so that the lengths of the channels increase at less than 1 μm per minute. It would be desirable to form channels at a faster rate to reduce the the cost of the process.

Moreover, processes which require anhydrous electrolytes incur added costs due to the precautions which must be taken to eliminate water from the solvents and to isolate the process from moisture in the environment. These processes incure further costs associated with purchase and disposal of the required organic solvents. It would be desirable to eliminate these costs. Also, because hydrofluoric acid is difficult and expensive to handle, it would be desirable to provide a process which can be operated without the use of hydrofluoric acid as a starting reagent.

It would also be desirable to provide microchannel plates with electron-emissive dynode materials having enhanced resistance to degradation during use, so as to provide a microchannel plate with a more stable, long-lasting gain.

SUMMARY OF THE INVENTION

The present invention addresses these needs.

One aspect of the present invention provides a method of forming high aspect ratio channels, desirably having aspect ratios of above about 20:1 and more preferably above about 30:1 at preselected locations in a silicon element. A method according to this aspect of the invention includes the steps of providing a p-doped silicon element having front and rear surfaces. The method further includes the steps of forming a plurality of pits at preselected locations on the front surface of the element and subjecting the pitted silicon element to an electrochemical etching procedure. In the electrochemical etching procedure, the front surface of the element and a counter electrode are maintained in contact with electrolyte while maintaining the silicon element at a positive potential with respect to the counter electrode. The element is etched preferentially at the pits to form channels extending through the silicon element, from the front surface towards the rear surface.

The term "p-doped silicon" as used in this disclosure refers to silicon having an appreciable quantity of p-type dopants such as B, Al and Ga, which tend to form positively charged sites, commonly referred to as holes in the silicon crystal lattice. Desirably, the silicon element contains at least about $10^{14}$ and more preferably at least about $10^{15}$ atoms of p-type dopants per cubic centimeter. The silicon element therefore has an appreciable number of holes in the silicon crystal lattice. The p-typed material may optionally include some n-type dopants as well as the p-type dopants, and its electrical characteristics may be p-type, n-type or compensated. Most typically, the material is doped only with p-type dopants, or with an excess of p-type dopants over n-type dopants, and hence exhibits p-type electrical conductivity with holes as the majority carriers.

This aspect of the present invention incorporates the discovery that when a p-doped material is provided with pits at preselected locations in its exposed surface, electrochemical etching will proceed at these preselected locations and will proceed in a highly selective manner with selective etching at the tips of the growing channels, so that the channels propagate as high aspect ratio, straight, unbranched channels extending into the silicon in a direction substantially perpendicular to the silicon surface. Most preferably, the silicon element is substantially monocrystalline silicon, such as a wafer of the type commonly used in a semiconductor fabrication or a portion cut from such a wafer. Desirably, the exposed surface of the silicon element is a <100> surface of the crystal.

According to a particularly preferred aspect of the invention, the electrolyte is an aqueous electrolyte which includes fluoride ions and a surfactant. The aqueous electrolyte desirably has a pH of about 1 to about 4, more desirably about 2 to about 4 and most desirably about 3 to about 4. Most desirably, the electrolyte includes an acid other than hydrofluouric and a fluoride salt as a source of fluoride ions. Whether the fluoride ions are added as HF or as salt, the resulting electrolyte contains some HF. The aqueous electrolyte desirably has an HF concentration at least 0.25M and more desirably between about 0.25M and 10M. HF concentrations of about 1.5 M to about 2M are most preferred. Inorganic acids and salts are preferred. For example, the electrolyte may include HCl and $NH_4F$. This preferred aspect of the present invention incorporates the realization that the teachings of the art, to the effect that etching of the p-type silicon with an aqueous electrolyte will result only in a branched microporous structure are incorrect.

Processes according to the most preferred aspects of the invention can form channels of high aspect ratio extending through silicon elements at preselected locations at a high etch rates, typically above 1 $\mu$m per minute. The most preferred processes do not require either the expense of anhydrous processing or the expense and hazards associated with handling and storing liquid HF as a starting reagent.

Methods according to the foregoing aspect of the present invention can be used to fabricate structures with numerous small channels extending through p-type silicon elements. These channels may have dimensions on the order of 100 nm to 25 micrometers or more with aspect ratios (the ratio of channel length to channel diameter) up to 500:1 or more. The channels can be placed at any desired locations on the silicon element. Where the structure is to be used in fabrication of a microchannel plate or MCP, the channels desirably are placed side by side in a closely spaced array, as by providing the pits in such an array prior to the electrochemical etching procedure.

Also, in manufacture of a device such as an MCP which requires that the channels extend entirely through the silicon element, the element is treated to form openings to the channels at the rear surface of the element. The etching process may be continued until the channels break through to the rear surface. More preferably however, the etching process is terminated when the channels extend partially through the silicon element and material is removed from the rear surface of the element, as by in non-selected etching or polishing process after forming the channels. The resulting perforated silicon element is provided with an electron-emissive dynode material on interior surfaces of the channels. Typically, the process includes the step of forming an electrically insulating layer such as a silicon dioxide layer on the interior surfaces, as by oxidizing the silicon element at the channel surfaces, or by depositing and electrically insulating material into the channels. The dynode material may be part of the insulating layer. That is silicon oxide and silicon nitride will serve as the electrically emissive dynode material. However, most desirably a separate dynode material such as the preferred dynode materials discussed below are deposited over the insulating layer. One or more additional layers may be deposited between the insulating layer and the dynode material to control the electrical conductivity along the length of the channel.

Methods according to this aspect of the present invention desirably also include the step of depositing electrically conductive materials on at least one of the front and rear surfaces, and desirably on both of the front and rear surfaces by directing the conductive material onto each such surface at an oblique angle to such surface. For example, the electrically conductive material may be a metal deposited by sputtering, evaporation or ion beam deposition with the atom of the metal directed at an oblique angle to the front and/or rear surfaces of the silicon element. This assures that the metal will not plug the openings of the channels at the front and rear surfaces, but provides conductive layers in the electrical contact with the dynode layers.

A further aspect of the present invention provides a microchannel plate with improved dynode materials. The dynode materials preferably are selected from the group consisting of nitrogen and oxygen doped or undoped polysilicon; $SnO_2$. $Sb:SnO_2$; indium tin oxide (ITO); $MgIn_2O_{4-x}$; $InGaO_{3-x}$; $ZnSnO_{3-x}$; $Zn_2In_2O_{5-x}$; $ZnGa_2O_{4-x}$; $Cr_2O_3$; $MnO_{2-x}$ and $Mn_2O_{3-x}$; potassium silicides; calcium suicides; barium silicides; cesium suicides; magnesium silicides; manganese suicides; and $Pb_yO_x$. The silicide dynode materials such as potassium, calcium, barium, cesium, magnesium and manganese silicides are particularly preferred. These materials provide enhanced secondary electron yield surfaces. The preferred dynode materials can be deposited by using vapor phase processes such as chemical vapor deposition and liquid phase processes such as electrolytic deposition, electrodeposition and electroless plating. The dynode materials may also be heat treated in a reactive atmosphere such as an oxidizing or nitriding atmosphere to adjust their stoichiometry and hence adjust electrical conductivity and secondary electron yield.

BRIEF DESCRIPTION OF THE DRAWINGS

FIGS. 3 through 6 are fragmentary diagrammatic sectional views of a silicon element at progressively later stages of treatment in a manufacturing process according to one embodiment of the present invention to form a microchannel plate in accordance with a further embodiment of the invention.

FIG. 7 is a fragmentary diagrammatic sectional view of the plate shown in FIGS. 3–6, on an enlarged scale, at completion of the manufacturing process.

DETAILED DESCRIPTION OF THE PREFERRED EMBODIMENTS

Figure 1:
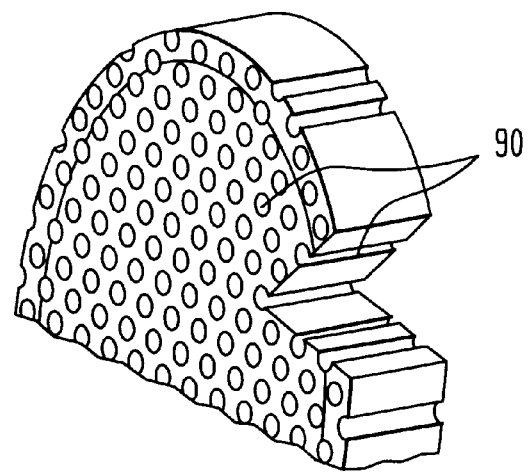
FIG. 1 is a diagrammatic perspective view of a conventional microchannel plate.
Figure 2:
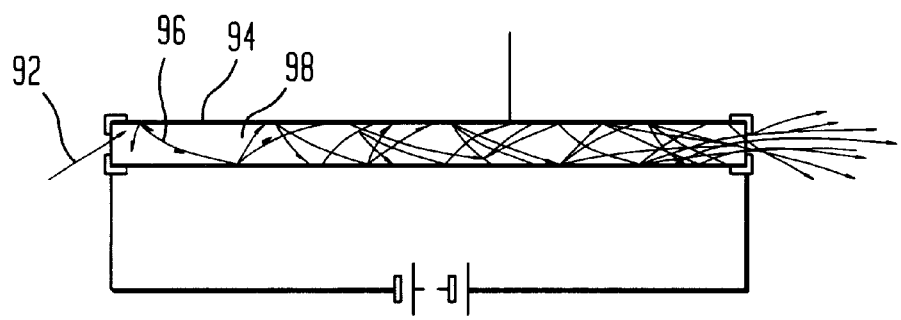
FIG. 2 is a diagrammatic sectional view of the plate shown in FIG. 1.

The process for fabricating a microchannel plate from a p-type silicon wafer begins with a p-type silicon element such as a substantially monocrystalline p-doped silicon wafer 10 having a front surface 12 and a rear surface 14. First, front surface 12 is oxidizied or nitrided to form a surface layer 16. A pattern is transferred into this surface layer using standard photolithographic techniques. The pattern may consist of any desired arrangement of circular or other shaped holes or apertures 18. The pattern of holes for example may be a square array of 2 $\mu$m diameter circular holes arranged on 6 $\mu$m centers. The pattern of holes is transferred to the silicon oxide/nitride surface by first coating the surface with a photoresist (not shown), properly curing, and then exposing the photoresist covered surface with an appropriate light source that has passed through a photolithographic mask containing the desired pattern of openings. The photoresist is then developed and openings created in the exposed regions. The exposed oxide/nitride areas are then etched using either wet or dry etching techniques to expose the underlying silicon substrate. The photoresist mask may then be removed. The silicon substrate is then etched through the remaining oxide/nitride mask to form depressions or pits 20 in the silicon. Pits 20 will serve as preferential etch sites during the electrochemical etching process. A method for making these depressions is to anisotropically etch the silicon in a solution of potassium hydroxide to produce an array of pyramidal pits in the <100> silicon surface having the same periodicity as the pattern on the photolithographic mask. The silicon oxide/nitride may then be removed. The pits have relatively large, open ends at the front surface 12 and relatively small, ends pointing pointed into the silicon element toward the rear surface 14.

An electrode 22 is fabricated on the back side of the wafer. The electrode may consist of an aluminum layer which has been evaporated onto the back of the wafer. The wafer is then placed into an electrochemical cell. The cell has a platinum cathode or counterelectrode 24, and the patterned etched front surface 12 of the silicon wafer serves as the anode. The etched surface faces into the cell. The cell is filled with an electrolyte. When the voltage is applied, the exposed front surface of the silicon element is etched, beginning at pits 20. The channels 30 gradually extend into the silicon element, beginning at the points of pits 20. The process is continued under these conditions until the desired channel length is produced.

The electrolyte may be an aqueous electrolyte containing fluoride and desirably having a pH of about 1 to about 7, more desirably between about 3 and about 4. The fluoride concentration desirably is about 0.25 to about 5 M. The electrolyte may consist essentially of HF and water, and a surfactant. More preferably, however, the electrolyte includes an acid other than HF and a fluoride salt, with or without a surfactant. Inorganic acids and salts are preferred. The preferred inorganic acids include HCl, $H_2SO_4$ and $H_3PO_4$, whereas the preferred inorganic fluoride salts include $NH_4F$ and flouroborate salts such as $NH_4BF_4$, and $HBF_4$. The surfactant may be anionic, cationic or nonionic. Suitable surfactants include ethanol, formaldehyde and the material sold under the trademark Triton X-100. The surfactant is added in an amount effective to promote wetting of the silicon surface by the electrolyte.

When using an aqueous electrolyte, the cell is biased so as to produce an electrochemical current density on the order of $3 \times 10^{-2}$ amps per $cm^2$, based on the area of the exposed silicon surface, without considering any increase in the surface area due to presence of pits or channels. The voltage applied between the silicon element and the counterelectrode desirably is between about 0.01 volts and 5 volts, more preferably between about 1.5 and 2.5 volts, and most preferably about 2 volts. The ratio of the exposed surface area of the silicon to the exposed surface area of the counterelectrode may be about 0.2 to about 100.

Alternatively, the electrolyte may be non-aqueous electrolyte such as anhydrous acetonitrile, 0.25 molar tetrabutylammonium perchlorate, 2 molar hydrogen fluoride. Other known non-aqueous electrolytes such as dimethylformaide, dimethylsulfoxide; propylene carbonate, metholene chloride and the like may be employed. Sources of fluoride ions other than HF may also be employed in the non-aqueous electrolyte. The tetributal ammonium per chlorite serves to increase the electrical conductivity of the electrolyte. Other additives may be employed for the same purpose. When using a non-aqueous electrolyte it is important to keep the residual amount of water in the solution low, <100 ppm.

When using a non-aqueous electrolyte, the cell is biased so as to produce an electrochemical current density on the order of $10^{-2}$ amps per $cm^2$, based on the area of the exposed silicon surface, without considering any increase in the surface area due to presence of pits or channels. The voltage applied between the silicon element and the counterelectrode desirably is between about 1.5 and 3 volts, more preferably between about 2 and 3 volts, and most preferably about 2.25 volts. The ratio of the exposed surface area of the silicon to the exposed surface area of the counterelectrode may be about 0.2 to about 100.

The etching processes discussed above are light-insensitive. The processes do not depend upon the presence of light for operation, and can be conducted in essentially any lighting conditions, including the complete absence of light or normal room lighting. Although some holes may be formed in the p-doped silicon by incident light, such holes are insignificant in comparison to the number of holes present as a result of p-doping.

After the channels have been etched, electrode 22 and any remaining silicon on the backside of the wafer is removed by any of a number of methods such as grinding and polishing, plasma etching or chemical back-thinning. The thinned wafer is now perforated from front to back. An oxide layer 28 is then grown on the perforated silicon by thermal means or by low pressure chemical vapor deposition. As best seen in FIG. 7, the oxide layer 28 forms a lining on the interior surfaces of channels 30. A typical oxidation treatment consists of heating the thinned and polished plate to temperatures on the order of 115° C. in flowing oxygen for times on the order of 1–12 hours to produce an oxide of the desired thickness. When the oxidation is carried out in this manner, there is no evident warping or distortion of the perforated plate. The perforated wafer may also be completely oxidized for a longer time by the same process to convert the bulk of the structure to silicon dioxide.

The silicon dioxide surface is then coated with a thin dynode film 32 to provide the strip resistance of the device and the electron emissive surface responsible for the channel gain. Typical materials for the dynode surface which have acceptable electrical conductivities and secondary electron emission properties include nitrogen and oxygen doped or undoped polysilicon and $SnO_2$. In addition there are conductive oxides and suicides that are more robust materials and exhibit acceptable secondary electron yields and electrical conductivities for use as channel wall coatings. These new materials include $Sb:SnO_2$, indium tin oxide (ITO), $MgIn_2O_{4-x}$, $InGaO_{3-x}$, $ZnSnO_{3-x}$, $Zn_2In_2O_{5-x}$, $ZnGa_2O_{4-x}$, $Cr_2O_3$, $MnO_{2-x}$ and $Mn_2O_{3-x}$ (where $0 \leq x \leq 1$), potassium silicides, calcium suicides, barium suicides, cesium suicides, magnesium silicides, manganese silicides, and $Pb_yO_x$, (where $1 \leq x \leq 3$ and $1 \leq y \leq 2$). These dynode materials can be deposited by many different techniques such as chemical vapor deposition (CVD), low pressure chemical vapor deposition (LPCVD), metalorganic chemical vapor deposition (MOCVD), metal organic deposition (MOD), sol-gel coating, electrolytic deposition, electrodeposition and electroless plating. The dynode films may be given a post deposition heat treatment in an oxidizing atmosphere to adjust the oxygen stoichiometry and hence adjust the electrical conductivity and secondary electron yield of the dynode to values acceptable for the application.

Following deposition of the dynode layer, metal layers 34 and 36 are deposited on the front and back sides of the MCP for the purpose of making electrical connection to the device. The metal layer is deposited using evaporation or sputtering so that the metal impinges on the surfaces of the MCP at an oblique angle as indicated by the arrows in FIG. 7 to prevent metal from depositing on the walls of channels 30 and occluding the channels. Some small amount of the metal may enter into the opening of the channels. Regardless of the theory of operation, the metal layers have electrical continuity with the dynode layers in the channels.

In summary, the most preferred total manufacturing process includes several major steps:
1. Definition of a pattern on the surface of a p-type silicon wafer.
2. Formation of preferential etch sites using the defined pattern.
3. Electrochemical etching of channels in the p-type silicon wafer.
4. Removal of the backside silicon beneath the etched channels.
5. Deposition of a dynode layer on the channel walls.
6. Heat treatment of the dynode layer to adjust the electrical conductivity and secondary yield.
7. Deposition of a conducting film on the front and back surfaces.

Numerous variations and combinations of the features discussed above may be utilized without departing from the present invention. For example, the process of forming channels can be employed in fabrication of structures other than micro channel plates. For example, a silicon element used as a semiconductor device such a semiconductor wafer or chip may incorporate channels extending partially or entirely through the element and these channels may be filled within metals such as aluminum to serve as electrical conductors extending in the vertical direction, towards and away form the front surface of the silicon element. These channels may extend entirely through the silicon element to the rear surface, or else may be "blind" channels extending only partially through the silicon element, depending upon the intended use of the device. The channels may be formed at any desired locations on the silicon element. However, where the channels are to be used as channels of the microchannel plate for electron amplification, it is most desirable to form the channels at closely spaced location, so that the channels extend side by side adjacent to one another. For example, the channels may be spaced at center to center distances less than about 20 micrometers and typically less than about 10 micrometers. The aggregate cross-sectional area of the channels in such an area may encompass up to about 60% and more preferably up to about 90% or more of the entire area of the front surface. The process thus can provide perforated plates which are ideally suited to manufacture of microchannel plates. The process can be controlled so as to form the channels in only some areas of the silicon element, leaving other areas without channels.

Figure 8:
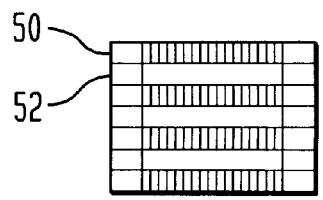
FIG. 8 is a diagrammatic sectional view of a multielement dynode in accordance with a further embodiment of the invention.

In the embodiments discussed above, the perforated silicon element is provided with two conductive electrodes on the front and rear surfaces, and the finished microchannel plate has substantial electrical resistance in the direction through the plate, so that a substantial potential gradient can be maintained along the length of each channel. However, perforated silicon elements formed as discussed above can also be used as dynodes in a multidynode device. As shown in FIG. 8, a plurality of perforated elements 50 having channels with electron-emissive interior surfaces are stacked one above the other, the individual elements being separated from one another by dielectric spacers 52 which do not block the channels. The perforated elements desirably are aligned with one another so that electrons can pass through all of the elements in succession. The individual elements are maintained at different electrical potentials, with the most positive potential at the last element. In this arrangement, each perforated element is only maintained at a single potential; there is no potential gradient between the surfaces of an individual element. Thus, the individual elements may be electrically conductive. For example, each element may have a metallic coating overlying the silicon on both surfaces or within the channels, and the emissive material may overlie or include such coating. The conductivity of the silicon itself may be used in the same manner. Thus, the emissive material may be disposed directly on the silicon, without any intervening insulating layer.

The following non-limiting examples illustrate certain features of the invention;

EXAMPLE 1

Aqueous Electrolyte 100 mm diameter oxidized silicon wafers are first patterned with circular holes 4 $\mu$m in diameter on 8 $\mu$m centers using conventional semiconductor processing. The patterned silicon is then subjected to an anisotropic KOH etch at 85° C. to produce a pyramidal shaped depression in the silicon surface. The oxide-masking layer is then removed and an aluminum film is deposited on the backside of the wafer for making electrical contact. The wafer is placed in an electrochemical cell containing the following electrolyte and operated at the specified voltage. The silicon is operated at positive potential relative to a platinum wire cathode:

Aqueous Conditions:
1. Electrolyte
   2.5 wt % HF
      125 ml 50% Aqueous HF
      2375 ml distilled $H_2O$
      3 ml Triton-x surfactant
2. Cell Voltage
   2.0 V The wafer is etched in the electrochemical cell until the desired channel length is reached. Typical etch rates for this electrolyte are 0.23 to 0.46 $\mu$m per min. or 13 to 28 $\mu$m per hour.

EXAMPLE 2

Aqueous Electrolyte 100 mm diameter silicon wafers covered with a silicon nitride film are first patterned with circular holes 4 $\mu$m in diameter on 8 $\mu$m centers using conventional semiconductor processing. The patterned silicon is then subjected to an anisotropic KOH etch at 85° C. to produce a pyramidal shaped depression in the silicon surface. The nitride-masking layer is left on the silicon wafer to prevent areas other than the holes from etching. An aluminum film is deposited on the backside of the wafer for making electrical contact. The wafer is placed in an electrochemical cell containing the following electrolyte and operated at the specified voltage. The silicon is operated at positive potential relative to a platinum wire cathode:

Aqueous Conditions:
1. Electrolyte
   2.5 wt % HF
      125 ml 50% Aqueous HF
      2375 ml distilled $H_2O$
      3 ml Triton-x surfactant
2. Cell Voltage
   2.0 V The wafer is etched in the electrochemical cell until the desired channel length is reached. Typical etch rates for this electrolyte are 0.23 to 0.46 $\mu$m per min. or 13 to 28 $\mu$m per hour.

EXAMPLE 3

Aqueous Electrolyte 100 mm diameter oxidized silicon wafers are first patterned with circular holes 4 µm in diameter on 8 µm centers using conventional semiconductor processing. The patterned silicon is then subjected to an anisotropic KOH etch at 85° C. to produce a pyramidal shaped depression in the silicon surface. The oxide-masking layer is then removed and an aluminum film is deposited on the backside of the wafer for making electrical contact. The wafer is placed in an electrochemical cell containing the following electrolyte and operated at the specified voltage. The silicon is operated at positive potential relative to a platinum wire cathode:

Aqueous Conditions:

1. Electrolyte

| | |
|---|---|
| $NH_4F$ (40 wt % aqueous solution) | 750 ml |
| HCl (36.5 wt % aqueous solution) | 300 ml |
| $H_2O$ | 1950 ml |
| Triton-x surfactant | 7.5 ml |

2. Cell Voltage 1.8 V

The wafer is etched in the electrochemical cell until the desired channel length is reached. Typical etch rates for this electrolyte are 1.3 µm per min average (78 µm per hr) for the run of 4.5 hours. The rate is initially 1.75 µm per min at time=0, and decreases over the time of the experiment to 1 µm per min at a depth of 300 µm.

EXAMPLE 4

Aqueous Electrolyte 100 mm diameter silicon wafers covered with with a silicon nitride film are first patterned with circular holes 4 µm in diameter on 8 µm centers using conventional semiconductor processing. The patterned silicon is then subjected to an anisotropic KOH etch at 85° C. to produce a pyramidal shaped depression in the silicon surface. The nitride-masking layer is left on the silicon wafer to prevent unpatterned areas from etching. An aluminum film is deposited on the backside of the wafer for making electrical contact. The wafer is placed in an electrochemical cell containing the following electrolyte and operated at the specified voltage. The silicon is operated at positive potential relative to a platinum wire cathode:

Aqueous Conditions:

1. Electrolyte

| | |
|---|---|
| $NH_4F$ (40 wt % aqueous solution) | 750 ml |
| HCl (36.5 wt % aqueous solution) | 300 ml |
| $H_2O$ | 1950 ml |
| Triton-x surfactant | 7.5 ml |

2. Cell Voltage 1.8 V

The wafer is etched in the electrochemical cell until the desired channel length is reached. Typical etch rates for this electrolyte are 1.3 µm per min average (78 µm per hr) for the run of 4.5 hours. The rate is initially 1.75 µm per min at time=0, and decreases over the time of the experiment to 1 µm per min at a depth of 300 µm.

EXAMPLE 5

Non-Aqueous Electrolyte 100 mm diameter oxidized silicon wafers are first patterned with circular holes 4 µm in diameter on 8 µm centers using conventional semiconductor processing. The patterned silicon is then subjected to an anisotropic KOH etch at 85° C. to produce a pyramidal shaped depression in the silicon surface. The oxide-masking layer is then removed and an aluminum film is deposited on the backside of the wafer for making electrical contact. The wafer is placed in an electrochemical cell containing the following electrolyte and operated at the specified voltage. The silicon is operated at positive potential relative to a platinum wire cathode:

Non-Aqueous Conditions:

1. Electrolyte 0.5 M tetrabutylammonium tetrafluoroborate in acetonitrile anhydrous acetonitrile ($H_2O$<50 ppm)

2. Cell Voltage 2.0 V

The wafer is etched in the electrochemical cell until the desired channel length is reached.

EXAMPLE 6

Non-Aqueous Electrolyte 100 mm diameter oxidized silicon wafers are first patterned with circular holes 4 µm in diameter on 8 µm centers using conventional semiconductor processing. The patterned silicon is then subjected to an anisotropic KOH etch at 85° C. to produce a pyramidal shaped depression in the silicon surface. The oxide-masking layer is then removed and an aluminum film is deposited on the backside of the wafer for making electrical contact. The wafer is placed in an electrochemical cell containing the following electrolyte and operated at the specified voltage. The silicon is operated at positive potential relative to a platinum wire cathode:

Non-Aqueous Conditions:

1. Electrolyte

2 M anhydrous HF in acetonitrile 0.25 M Tetrabutylammonium perchlorate in acetonitrile anhydrous acetonitrile ($H_2O$<50 ppm)

2. Cell Voltage 2.0 V

The wafer is etched in the electrochemical cell until the desired channel length is reached.

EXAMPLE 7

Figure 9:
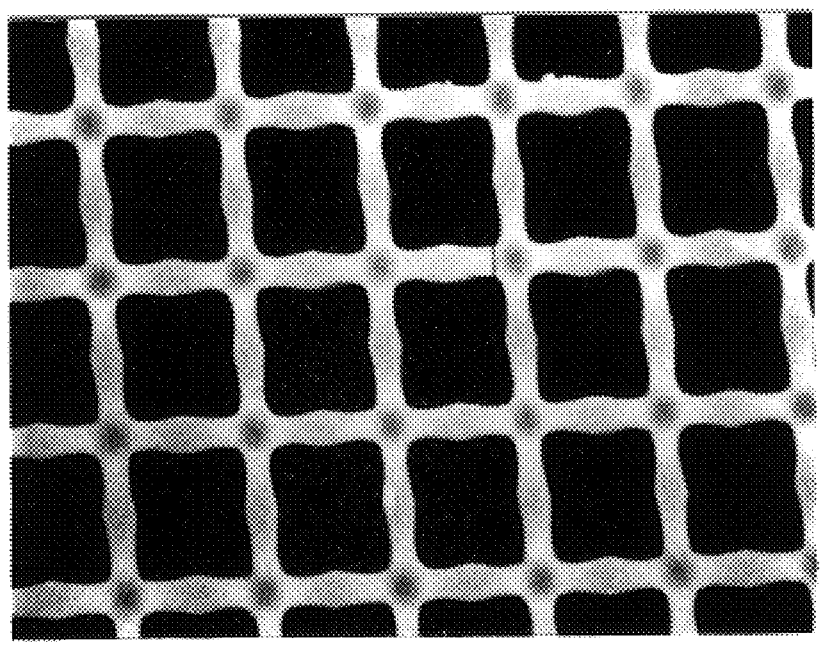
FIG. 9 is a microphotographic plan view at 2000× magnification of a silicon element etched according to one embodiment of the invention.
Figure 10:
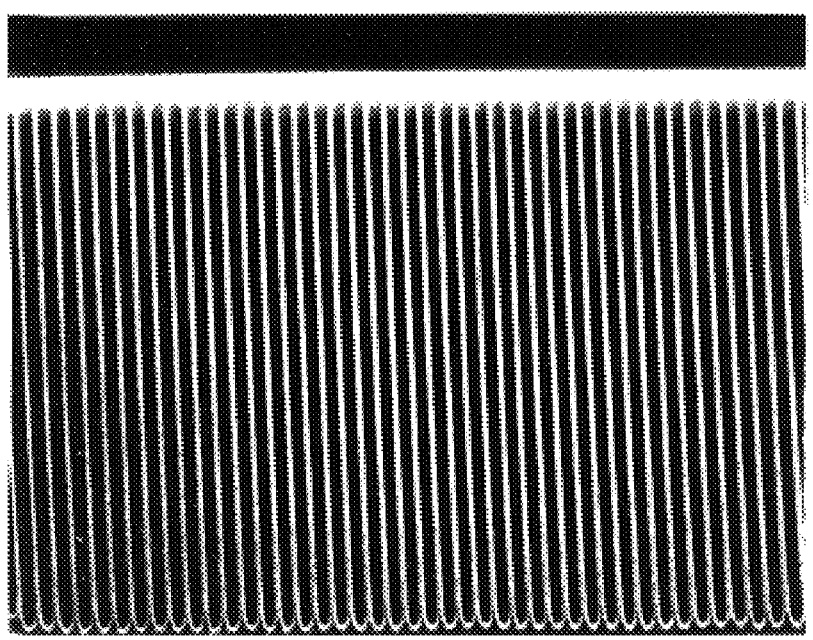
FIG. 10 is a microphotographic sectional view at 410× magnification of the element depicted in FIG. 8, with portions removed to show interior structure.

Aqueous Electrolyte p-type <100> silicon, resistivity ~10 ohm-cm, is etched in an electrolyte of 2.5 wt. % hydrofluoric acid in water with a few drops of a surfactant to improve wetting of the silicon surface. The silicon surface is dimpled by first oxidizing the silicon surface then applying a photoresist and exposing through a mask that has a square array of 3µ holes placed on 6µ centers. The exposed photoresist is removed and the wafer exposed to a $CF_4O_2$/Ar plasma for a few minutes to transfer the mask pattern into the silicon surface. The photoresist mask is removed and the wafer is given an anisotropic etch in 10 wt. % KOH in water at 90° C. to form a pyramidal pit in the Si surface. The silicon oxide is then removed by a dilute hydrofluoric acid etch. An aluminum film is deposited on the back side of the silicon to form the ohmic contact. The aluminum film is baked at 400° C. for 2 minutes. The front side of the silicon wafer is then placed in contact with an electrolyte containing 2.5 wt. % hydrofluoric acid containing a few drops of the surfactant Triton-X for the electrochemical etch. The aluminum film on the back side of the silicon wafer is connected to a power supply set at 3 volts. A typical electrochemical current of ~300 mA flows for an exposed area of ~50 cm$^2$. The process is allowed to continue for 180 minutes. The voltage is removed and the silicon removed from the etching apparatus and thoroughly rinsed with deionized water. The resulting pore structures are shown in FIGS. 8 and 9.

What is claimed is:

1. A method of forming high aspect ratio channels at preselected locations in a silicon element comprising the steps of:

(a) providing a p-doped silicon element having front and rear surfaces;

(b) forming a plurality of pits in the front surface of the element at preselected locations on said surface; and (c) maintaining the front surface of the element and a counterelectrode in contact with an electrolyte while maintaining the element at a positive potential with respect to the counterelectrode, so that the element is etched preferentially at said pits to form channels extending side-by-side through the silicon element, from said front surface towards said rear surface.

2. A method as claimed in claim 1 wherein said electrolyte is an aqueous electrolyte.

3. A method as claimed in claim 2 wherein said aqueous electrolyte includes fluoride ions and has a pH of about 1 to 7.

4. A method as claimed in claim 3 wherein said aqueous electrolyte has a fluoride concentration of about 0.25 to about 5 M.

5. A method as claimed in claim 3 wherein said aqueous electrolyte includes an acid other than HF and a fluoride salt.

6. A method as claimed in claim 5 wherein said fluoride salt is selected from the group consisting of fluoroborate salts.

7. A method as claimed in claim 5 wherein said fluoride salt is NH$_4$F.

8. A method as claimed in claim 3 wherein said electrolyte includes HCl and NH$_4$F.

9. A method as claimed in claim 3 wherein said aqueous electrolyte includes a surfactant.

10. A method as claimed in claim 1 wherein said electrolyte is a non-aqueous electrolyte.

11. A method as claimed in claim 10 wherein said non-aqueous electrolyte includes less than about 100 parts per million water by weight.

12. A method as claimed in claim 1 further comprising the step of forming openings to said channels at said rear surface of said element.

13. A method as claimed in claim 12 wherein said step of forming said openings includes the step of removing material from said rear surface after forming said channels.

14. A method as claimed in claim 12 further comprising the step of providing an electron-emissive dynode material on interior surfaces of said channels.

15. A method as claimed in claim 14 further comprising the step of forming an electrically insulating layer on the interior surfaces of said channels prior to said step of providing said dynode material.

16. A method as claimed in claim 15 wherein said step of forming an electrically insulating layer includes the step of oxidizing silicon in said element at said channel surfaces.

17. A method as claimed in claim 15 wherein said step of forming an electrically insulating layer includes the step of depositing electrically insulating material in said channels.

18. A method as claimed in claim 14 wherein said dynode material is selected from the group consisting of nitrogen and oxygen doped or undoped polysilicon; SnO$_2$. Sb:SnO$_2$; indium tin oxide (ITO); MgIn$_2$O$_{4-x}$; InGaO$_{3-x}$; ZnSnO$_{3-x}$; Zn$_2$In$_2$O$_{5-x}$; ZnGa$_2$O$_{4-x}$; Cr$_2$O$_3$; MnO$_{2-x}$ and Mn$_2$O$_{3-x}$; (where $0 \leq x \leq 1$) potassium silicides; calcium suicides; barium silicides; cesium suicides; magnesium silicides; manganese suicides; and Pb$_y$O$_x$ (where $1 \leq x \leq 3$ and $1 \leq y \leq 2$).

19. A method as claimed in claim 14 further comprising the step of depositing an electrically conductive material on at least one of the front and rear surfaces of said element by directing the conductive material onto said at least one surface at an oblique angle to such surface.

20. A method as claimed in claim 1 wherein said step of forming said pits includes the step of forming a layer of a silicon oxide or silicon nitride on said front surface, forming apertures in said layer at said preselected locations, and anisotropically etching the silicon in said element through said apertures.

21. A method as claimed in claim 1 wherein said pits taper from a relatively wide opening at said front surface to a relatively narrow point beneath said front surface.

22. A microchannel plate comprising an element having a front surface, a rear surface and a plurality of channels extending therethrough, said channels having interior surfaces, and a dynode material on said interior surfaces, said dynode material being selected from the group consisting of nitrogen and oxygen doped or undoped polysilicon; SnO$_2$. Sb:SnO$_2$; indium tin oxide (ITO); MgIn$_2$O$_{4-x}$; InGaO$_{3-x}$; ZnSnO$_{3-x}$; Zn$_2$In$_2$O$_{5-x}$; ZnGa$_2$O$_{4-x}$; Cr$_2$O$_3$; MnO$_{2-x}$ and Mn$_2$O$_{3-x}$ (where $0 \leq x \leq 1$); potassium silicides; calcium silicides; barium silicides; cesium silicides; magnesium silicides; manganese silicides; and Pb$_y$O$_x$ (where $1 \leq x \leq 3$ and $1 \leq y \leq 2$).

23. A microchannel plate as claimed in claim 22 wherein said element includes a silicon body and a layer of an insulating material on said interior surfaces of said channels between said dynode material and said silicon body.

24. A microchannel plate as claimed in claim 23 wherein said layer of insulating material includes silicon dioxide.

25. A microchannel plate as claimed in claim 22 further comprising electrically conductive electrodes overlying said front and rear surfaces in contact with said dynode layers but not occluding said channels.

26. A p-doped silicon body having a front surface, a rear surface and a plurality of channels extending therethrough at regularly spaced locations, at substantially constant center-to-center distances said channels having diameters between about 100 nm and 2 μm and aspect ratios above about 20:1.

* * * * *

UNITED STATES PATENT AND TRADEMARK OFFICE
CERTIFICATE OF CORRECTION

PATENT NO.: 5,997,713
DATED: December 7, 1999
INVENTOR(S): Beetz, Jr. et al.

It is certified that error appears in the above-identified patent and that said Letters Patent is hereby corrected as shown below:

Column 2, line 2, "$10^9\phi$." should read --$10^9\Omega$.--
Column 6, line 11, "calcium suicides;" should read --calcium silicides;--
Column 6, line 12, "cesium suicides;" should read --cesium silicides;--
Column 6, line 13, "manganese suicides;" should read --manganese silicides;--
Column 8, line 47, "suicides" should read --silicides--
Column 8, line 53, "calcium suicides," should read --calcium silicides,--
Column 8, line 53, "barium suicides," should read --barium silicides,--
Column 8, line 53, "cesium suicides," should read --cesium silicides,--
Column 14, line 12, "calcium suicides;" should read --calcium silicides;--
Column 14, line 13, "cesium suicides;" should read --cesium silicides;--
Column 14, line 14, "manganese suicides;" should read --manganese silicides;--

Signed and Sealed this

Twelfth Day of September, 2000

*Attest:*

Q. TODD DICKINSON

*Attesting Officer*      *Director of Patents and Trademarks*